United States Patent [19]

Matsushita

[11] Patent Number: 5,238,858
[45] Date of Patent: Aug. 24, 1993

[54] ION IMPLANTATION METHOD

[75] Inventor: Tadashi Matsushita, Tenri, Japan

[73] Assignee: Sharp Kabushiki Kaisha, Osaka, Japan

[21] Appl. No.: 824,718

[22] Filed: Jan. 17, 1992

Related U.S. Application Data

[63] Continuation of Ser. No. 426,972, Oct. 25, 1989, abandoned.

[30] Foreign Application Priority Data

Oct. 31, 1988 [JP] Japan .................. 63-276983

[51] Int. Cl.$^5$ .................................. H01L 21/265
[52] U.S. Cl. ............................ 437/27; 437/30; 437/248
[58] Field of Search .............. 437/24, 26, 27, 29, 437/930, 248; 148/DIG. 82, DIG. 83, DIG. 76, DIG. 77, DIG. 128

[56] References Cited

U.S. PATENT DOCUMENTS

| | | | |
|---|---|---|---|
| 3,897,276 | 7/1975 | Kondo | 437/30 |
| 4,106,953 | 8/1978 | Onoderk | 437/30 |
| 4,411,708 | 10/1983 | Winham | 437/27 |
| 4,784,965 | 11/1988 | Woo et al. | 437/30 |
| 4,845,045 | 7/1989 | Shacham et al. | 437/30 |
| 4,975,385 | 12/1990 | Beinglass et al. | 437/30 |

FOREIGN PATENT DOCUMENTS

| | | | |
|---|---|---|---|
| 57-18701 | 4/1982 | Japan . | |
| 61-226921 | 10/1986 | Japan | 437/30 |
| 61-264741 | 11/1986 | Japan | 437/30 |
| 1-72523 | 3/1989 | Japan | 437/30 |
| 1-28521 | 5/1989 | Japan . | |
| 2-278882 | 11/1990 | Japan . | |
| 2-288330 | 11/1990 | Japan . | |
| 3-278430 | 12/1991 | Japan . | |

OTHER PUBLICATIONS

Hammer, W. "Cooling Ion Implantation Target", *IBM Technical Disclosure Bulletin* vol. 19, No. 6, Nov. 1976 pp. 2270-2271.

Mayer, J., et al., *Ion Implantation In Semiconductors: Silicon and Germanium*, New York, 1970, pp. 108-112.

Primary Examiner—George Fourson
Attorney, Agent, or Firm—Cohen, Pontani, Lieberman, Pavane

[57] ABSTRACT

An ion implantation method for forming a high concentration dopant implanted layer in a semiconductor substrate comprising irradiating an ion beam of a desired dopant in the semiconductor substrate and annealing the resultant, in which the irradiation of the ion beam is conducted with stepwise reduction of an acceleration energy for the ion beam, intercepting at least for a period during its reduction being proceeded, whereby affording the high concentration dopant implanted layer distributed as a substantially contiguous amorphous layer, and an ion implantation apparatus comprising an ion source, ion attracting means for attracting ions from the ion source, ion selecting means for selecting specified ions among the ions attracted by the ion attracting means, accelerating means for accelerating a beam of the specified ions selected by the ion selecting means with an acceleration energy stepwise reduced, beam scanning means for scanning a direction of the ion beam accelerated by the accelerating means, a sample cell having an opening through which the ion beam scanned by the beam scanning means is introduced thereto, intercepting means for intercepting the ion beam introduced to the sample cell and control means for controlling the accelerating means and the intercepting means in operation.

5 Claims, 5 Drawing Sheets

ION IMPLANTATION METHOD

This is a continuation of U.S. application Ser. No. 07/426,972, filed Oct. 25, 1989, now abandoned.

BACKGROUND OF THE INVENTION

1. Field of the Invention

The present invention relates to an ion implantation method for forming a dopant implanted layer in a semiconductor substrate and an apparatus for the same.

2. Description of the Prior Art

In manufacturing a semiconductor integrated circuit device, an ion implantation method is commonly used because dopants can thereby be introduced with high accuracy into a very small region in a semiconductor substrate.

FIG. 5 is a schematic view showing the structure of a conventional ion implanting apparatus. The apparatus comprises an ion source 31 and an ion attracting electrode 32. A mass analysis magnet 33 selects dopant ions drawn from the ion source, 31 by the ion attracting electrode 32 so that only a desired kind of ion passes therethrough. An ion accelerator 34 accelerates a beam (A) comprising the desired ion selected by the mass analysis magnet 33. An X-Y scanner 35 controls the moving direction of an accelerated ion beam (B) by focusing and deflecting the beam. An ion beam (C) scanned in an X-Y direction at the X-Y scanner 35 irradiates a wafer 37 held in a sample cell 36. A holder of the wafer 37 in the sample cell 36 includes a mechanism for a mechanical scan and for cooling of a sample by refrigerant or the like. Predetermined dopants can be implanted to a desired region of the semiconductor substrate by forming a mask on the surface of the wafer 37 having a prescribed pattern that defines the region to be implanted with ions.

The energy of the ions which are to be implanted on the wafer 37 is determined by an ion attracting voltage from the ion source 31 and a voltage applied by the ion accelerator 34. Therefore, this energy is determined by the voltage of the ion accelerator when the ion attracting voltage is kept at a constant value.

Generally, the voltage value of the accelerator 34 is set at a predetermined value. FIG. 6 is a graphic representation of the distribution of implanted ions (ions/cm$^3$) with regard to a depthwise implantation ($\mu$m) in a sample (Si) when the voltage is set at a constant value. As will be recognized from FIG. 6, the distribution of the implanted ions assumes a Gaussian distribution in which the peak of the ion concentration is in a region II depending upon the implanted energy. It should be noted that a region (I), which is closer to the surface, and a region III, which is deeper in the sample, contain much smaller numbers of dopant ions compared to the region II in this FIG. 6 distribution.

It is characteristic of this process that damages are caused in the dopant implanted layer by ion implantation and are concentrated near a position where the implanted ions rest. Therefore, damages such as a crystal defect caused in the region II are much more serious than those caused in the regions (I), III , and such damages may include complicated dislocation, clusters, etc. Further, where the prior art ion implantation method is used for the formation of a high concentration dopant region such as the source-drain formation in a MOS transistor, dopants implanted in the region II may often be far beyond the solubility of the dopants in a solid Si. Accordingly, annealing with a high temperature or annealing for a long period of time so as to diffuse implanted dopants in the regions I, III must be enough to fully activate the implanted ions and displace the same to aimed positions. Annealing with a high temperature or annealing for a long period of time as in the above forces dopant ions to diffuse in the lateral direction in the ion implanted layer, which causes a poor integration of the device. In addition to that, such a heat treatment has an adverse effect on other parts of the device. Thus, there is a problem that fully activating and annealing the dopant implanted layer is very difficult, allowing for coordination with other manufacturing steps.

SUMMARY OF THE INVENTION

Accordingly, the present invention provides an ion implantation method for forming a high concentration dopant implanted layer in a semiconductor substrate comprising irradiating a semiconductor substrate with an ion beam of a desired dopant followed by annealing the substrate, in which the irradiation with the ion beam is conducted by a stepwise reduction of an acceleration energy for the ion beam, intercepted at least for a period while the beam acceleration is being reduced, whereby a high concentration dopant implanted layer is distributed as a substantially contiguous amorphous layer. The invention further provides an ion implantation apparatus comprising an ion source, ion attracting means for attracting ions from the ion source, ion selecting means for selecting specified ions among the ions attracted by the ion attracting means, accelerating means for accelerating a beam of the specified ions selected by the ion selecting means with a stepwise reduced acceleration energy, beam scanning means for scanning a direction of the ion beam accelerated by the accelerating means, a sample cell having an opening through which the ion beam scanned by the beam scanning means is introduced, intercepting means for intercepting the ion beam introduced into the sample cell, and control means for controlling the accelerating means and the intercepting means in operation.

According to the above elements of the present invention, a predetermined dopant is implanted from the surface of the semiconductor substrate in the depthwise direction at a concentration such as to form an amorphous layer consisting of a point defect and an amorphous cluster layer contiguous thereto, whereby the semiconductor substrate can be annealed at a low temperature for a short time.

DETAILED DESCRIPTION OF THE PREFERRED EMBODIMENT

Figure 1:
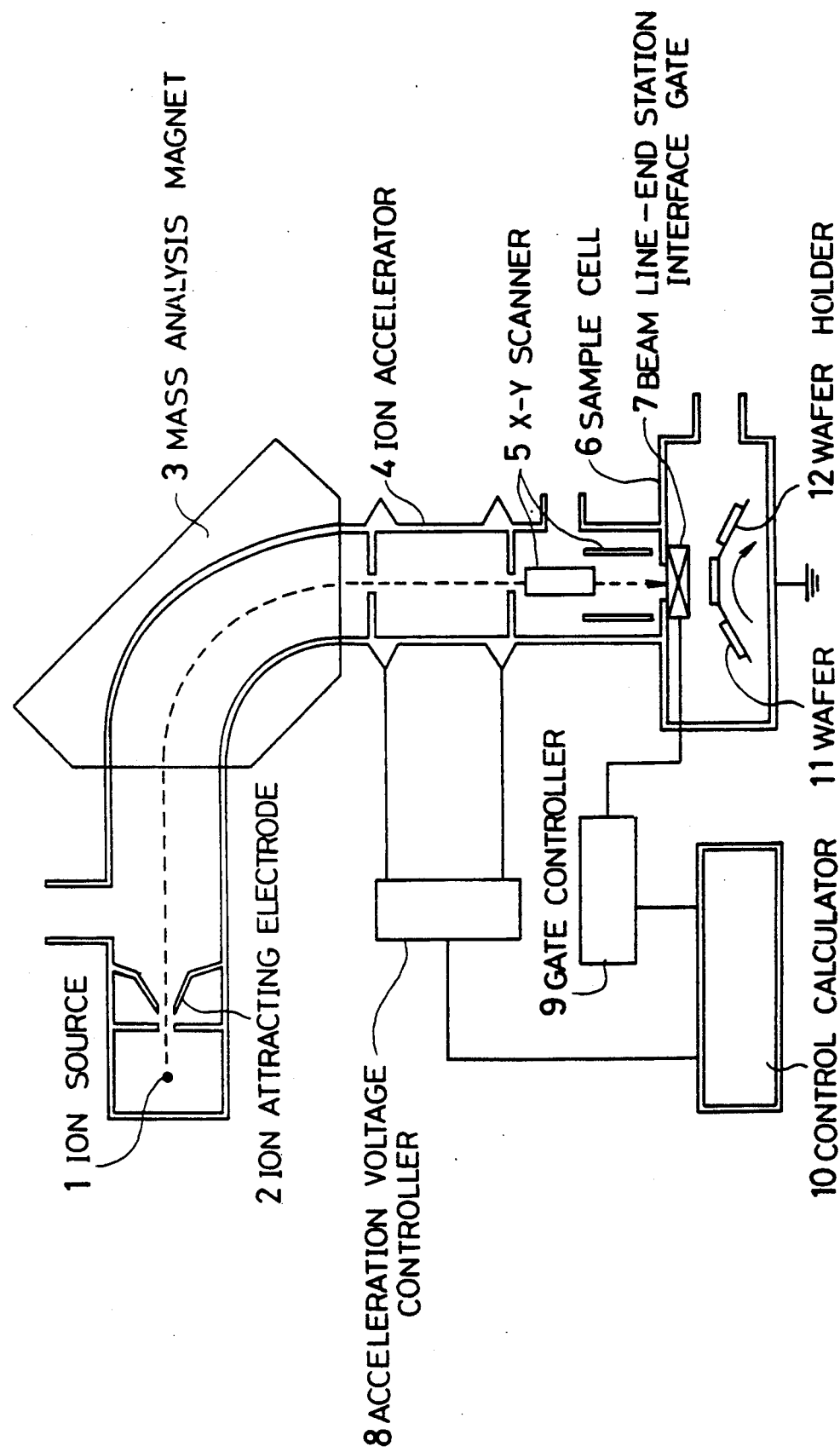
FIG. 1 is a schematic view of an ion implanting apparatus according to the present invention.

In accordance with an ion implantation method of the present invention, irradiation of an ion beam onto a semiconductor substrate is performed with a stepwise reduction of an acceleration energy of the ion beam from high energy to low energy. The ion beam is intercepted at least for a period during reduction of the acceleration energy, whereby a high concentration dopant ion implanted layer is formed in the semiconductor substrate. Such dopant implanted layer substantially consists of contiguous amorphous layers.

The ion beam may be directed by dividing the irradiation so that an amount of dopant introduced each time is such as to easily recover defects of implantation by annealing and to be below the solubility of the dopant to the semiconductor substrate.

The interception may be performed for a period of time sufficient to maintain the acceleration energy of the ion beam at a predetermined reduced value and sufficient to fully cool the surface of the semiconductor substrate.

In an ion implanting apparatus used with the method of ion implantation according to the present invention, an ion source known in this field may be used; for example, such an ion source may produce ions by generating a plasma including a required type of ions from a solid or gas.

Ion attracting means includes an ion attracting electrode for attracting ions produced from the ion source and a power source for applying a predetermined voltage to the ion attracting electrode.

Ion selecting means is typically a mass analysis magnet.

Accelerating means basically includes an ion accelerator disposed between the ion selecting means and a beam scanning means, and an acceleration voltage controller for controlling acceleration voltage applied to the ion accelerator. The acceleration voltage controller changes the acceleration voltage applied to the ion accelerator to change the acceleration energy of the ion beam accordingly.

The beam scanning means includes an X-Y scanner having two pairs of scanning electrodes; one pair thereof is disposed in an X-direction with regard to the proceeding direction of the ion beam and the other is disposed in an Y-direction.

A sample cell has basically the same constitution as that generally known in this field, but the sample cell of the present invention is different from the prior art sample cell in that it has a gate for blocking an opening used for introduction of the ion beam.

The gate is a part of the intercepting means. In accordance with an instruction to block the opening from the control means, a gate controller controls the gate to block the opening at least at the times during which the acceleration energy of the ion beam is being changed. The gate is, for example, provided slidably on a guide rail to open or close the opening in the sample cell. The gate slides along the guide rail by a press piston which is controlled by the gate controller and moved by a high pressure gas.

Control means may be a control calculator which comprises a program for setting a condition of ion implantation for forming an amorphous ion implanted layer having a high efficiency of annealing from data obtained by an experiment and data obtained by coordinating the data obtained by the experiment with other process conditions and for executing the ion implantation based upon the conditions, whereby the accelerating means is controlled to reduce the acceleration energy and the intercepting means is controlled to intercept the ion beam.

The embodiment according to the present invention will now be described with reference to the drawings. FIG. 1 is a schematic view showing the structure of an ion implanting apparatus according to the present invention. The ion implanting apparatus comprises an ion source 1, an ion attracting electrode 2, a mass analysis magnet 3, an ion accelerator 4, an X-Y scanner 5, a sample cell (end station) 6, a beam line—end station interface gate 7, an acceleration voltage controller 8, a gate controller 9 and a control calculator 10. In the ion source 1, if a source of solid is used and the solid is heated to a high enough temperature by a heater to produce source vapor. The source vapor is ionized by collision with electrons emitted from a filament to produce ions. It the source is gas, the gas is ionized in a method that is similar to that used for the source vapor. The ions produced from the ion source 1 are drawn to the beam line from the ion source 1 by the ion attracting electrode 2 thereby becoming a beam of ions (shown in a broken line in FIG. 1). While the ion beam passes through the mass analysis magnet 3, a certain type of ions are specified depending on the difference of mass of the ions in the ion beam. Thus, a beam (A) of the specified ions is introduced to the ion accelerator 4. The ion beam (A) is accelerated by the ion accelerator 4 to become an ion beam (B), and then the ion beam (B) is deflected by a deflection control function of the X-Y scanner 5 and is scanned over the surface of the wafer 11 in the sample cell 6. The wafer 11 is fixed to a wafer holder 12 having a mechanical scan mechanism (not shown). The beam line - end station interface gate 7 is provided at the inlet of the sample cell 6 through which the ion beam is introduced, and the gate is controlled by the gate controller 9. Opening and closing control of the gate 7 is automatically performed in accordance with a program for ion implantation stored in the control calculator 10.

In the case where an ion implanted layer is treated with heat through a lamp annealing at 800° C. for 10 minutes (this is a main heat-treatment which contributes to annealing of a semiconductor wafer after an ion implantation treatment, and the time and temperature required depend on a type of device, etc.), the condition of ion implantation is decided as follows: In general, the ion implanted layer (which is treated through lamp annealing at 800° C. for 10 minutes after the ion implantation treatment) is evaluated easily by measuring sheet resistance $\rho_S$ ($\Omega/\square$). An approximation of the sheet resistance which has a physical meaning is obtained by a function related to a depthwise direction $\chi$, namely, $$\rho_S(\chi) = \frac{1}{e \int_\chi^S \eta(\chi)\mu(\chi)d\chi}$$

where $\eta$ is a concentration of a carrier and $\mu$ is a mobility of the carrier.

In order to confirm whether implanted dopant ions effectively contribute to annealing in the heat treatment subsequent to the ion implantation, a concentration Ns of sheet carriers in the ion implanted layer may be measured. Particularly according to the present invention, to determine a condition of ion implantation for performing an annealing treatment, a classical measuring technique is employed, namely, a Van dea PAUW method.

An approximation of the sheet carrier concentration Ns is obtained by a simplified formula $$Ns = \frac{B_z \cdot I_x}{V_H \cdot e} \times 10^{-5} \text{ [carriers/cm}^2\text{]}$$

where magnetic field is $B_z$, electric current is $I_x$, hole voltage $V_H$ and electric charge of an electron e.

The sheet resistance $\rho_S$ is obtained by the Van dea PAUW method as follows:

$$\rho_S = 4.532 \times \frac{(\gamma_{AB\cdot CD} + \gamma_{BC\cdot DA})}{2} f$$

where f is a factor of the form of a sample, $\gamma_{AB\cdot CD}$ is potential difference between terminals C, D divided by electric current flowing between terminals A, B, and $\gamma_{BC\cdot DA}$ is potential difference between terminals D, A divided by electric current flowing between terminals B, C. In the decision on the ion implantation condition, data about a sheet resistance measured through a four point probe method is also taken into consideration. An approximation of hole mobility $\mu_H$ [cm$^2$/V sec] in the ion implanted layer is obtained by a simplified formula as follows:

$$\mu_H = \frac{1}{\rho_X \cdot e \cdot Ns} \text{ [cm}^2\text{/V sec]}$$

It should be understood that when the quotient $N_A$ (obtained by dividing the sheet carrier concentration Ns, which is obtained by the above method, by an amount of implanted ions, and the value of the hole mobility $\mu_H$ are higher, the ion implanted layer has been annealed well. (In practice, a device characteristic should be carefully judged). The optimum condition, under which recovery from a defect caused by ion implantation is made most efficiently, is decided so that the largest values Ns, $\mu_H$ are given in the lamp annealing at 800° C. for 10 minutes, but a balance of both the values should be taken into consideration because the hole mobility $\mu_H$ generally becomes smaller as the sheet carrier concentration Ns becomes larger. Accordingly, the ion implantation condition is programmed based upon conditions of a type and amount of implanted ions and of a heat treatment after the ion implantation. It should be noted that the condition of the heat treatment is not the only criterion, but capability of an ion implanting apparatus and its operation rate are criteria for the programming.

Physical phenomena are applied to the present invention; for example, one of them is such that a damage caused by $10^{15}$ ions/cm$^2$ is easily recovered compared with a damage caused by $10^{14}$ ions/cm$^2$ or $10^{16}$ ions/cm$^2$ in a common annealing treatment, if the optimum condition under which a defect caused by ion implantation can be easily recovered is programmed as an implantation of As ions at 80 KeV. An ion implantation according to the present invention for forming an amorphous layer consisting of a point defect and a amorphous cluster layer contiguous thereto results in forming an amorphous layer (defective layer) identical in property with a defect caused by the aforementioned ion implantation, though there are some variations in property depending upon the type of implanted ions.

The control calculator 10 stores a program for setting a condition of ion implantation for forming an amorphous ion implanted layer having a high efficiency of annealing from data obtained by an experiment and data obtained by coordinating the data obtained by the experiment with other process conditions and for executing the ion implantation based upon the condition, whereby acceleration voltage can be adjusted to an arbitrary value. The acceleration voltage controller 8 and an opening and closing mechanism for the beam line—end station interface gate 7 are controlled in accordance with the program stored in the gate controller 9.

Figure 2:
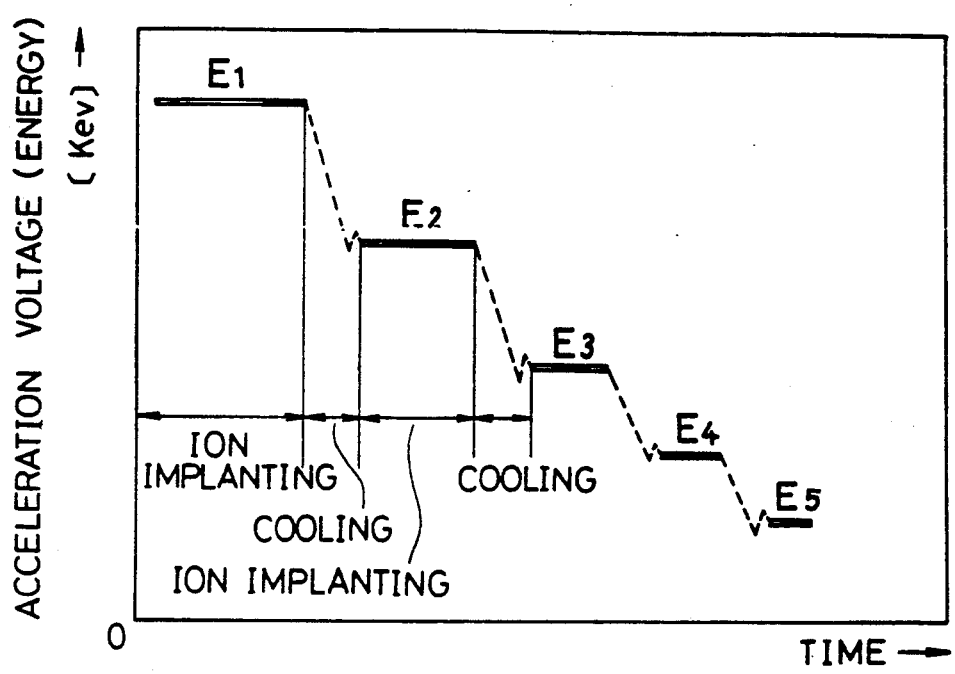
FIG. 2 is a graph showing an example of an application pattern of acceleration voltage when an embodiment according to the present invention is used.

The above ion implanting apparatus works in accordance with the program to vary acceleration voltage applied to ions in stages as shown in FIG. 2 from the original acceleration voltage $E_1$ to lower acceleration voltages $E_2$, $E_3$ . . . as time passes. Further, in the ion implanting apparatus, the beam line —end station interface gate 7 is closed to completely intercept a beam directed at the wafer 11 while the acceleration voltage is varying to a lower value, so that the surface of the wafer 11 is fully cooled down. As to the cooling, it requires a period of time enough to keep the acceleration voltage and the beam current at a predetermined value and to fully cool the surface of the wafer 11. In the case that it takes a long period of time to implant ions at a constant acceleration voltage, namely, that a great deal of ions are implanted in some deep position of the wafer 11, ion implantation is carried out by dividing the irradiation of the ion beam with periods for cooling the surface of the wafer 11 intervening in the course of the implantation.

Figure 3:
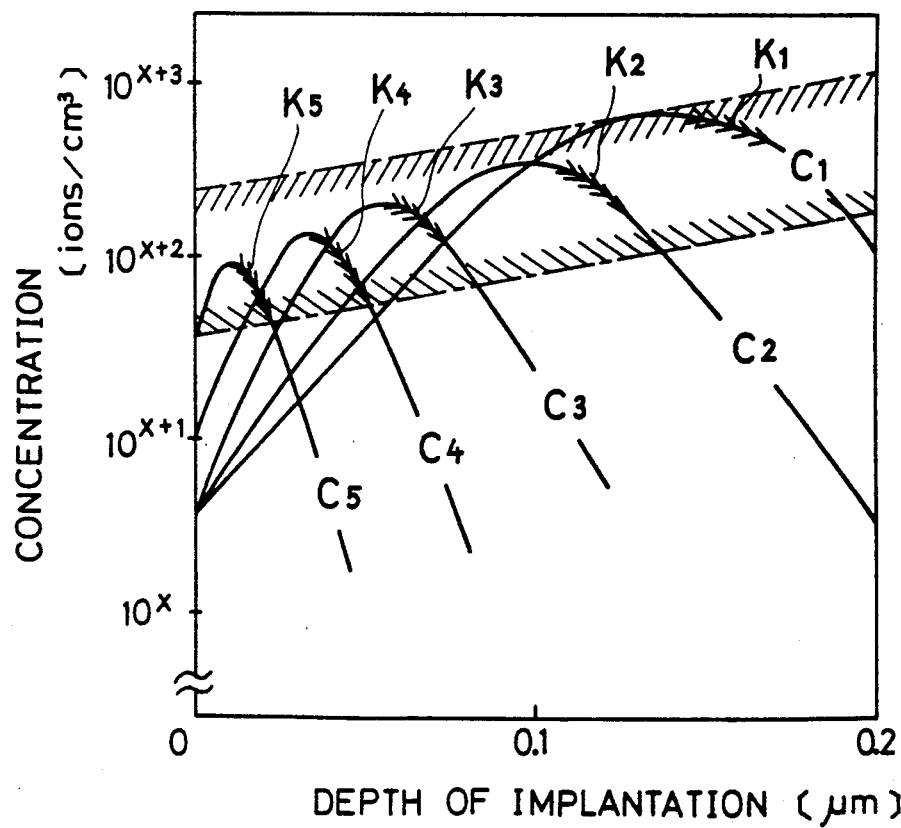
FIG. 3 is a graph showing an implanted ion distribution from the surface of a Si wafer in the depthwise direction when the embodiment is used.
Figure 4A:
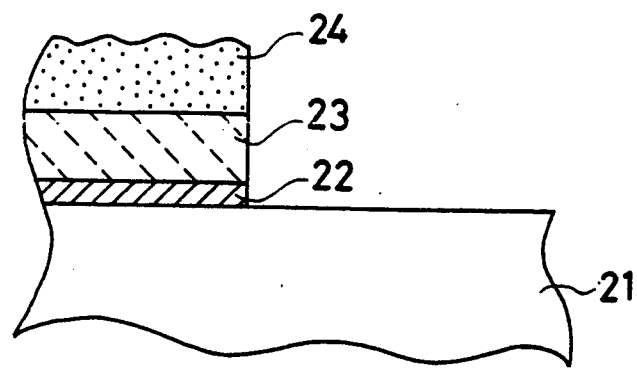
FIGS. 4(a)-4(f) are views showing steps of a manufacturing process in which the present invention is applied to a source-drain formation in a MOS field effect transistor.
Figure 4B:
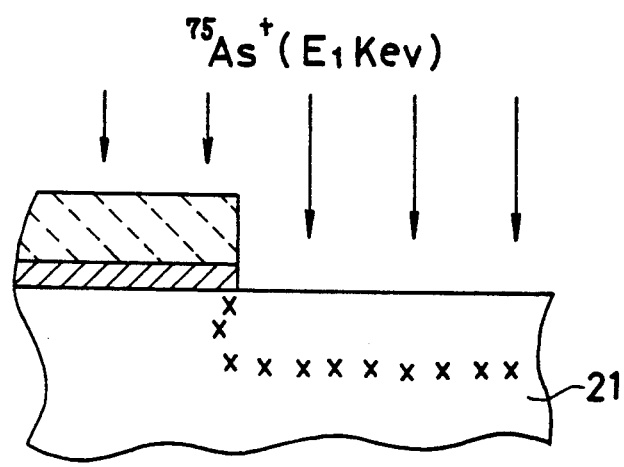
Figure 4C:
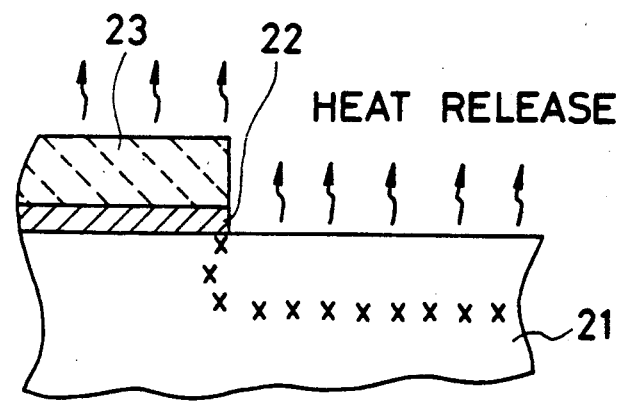
Figure 4D:
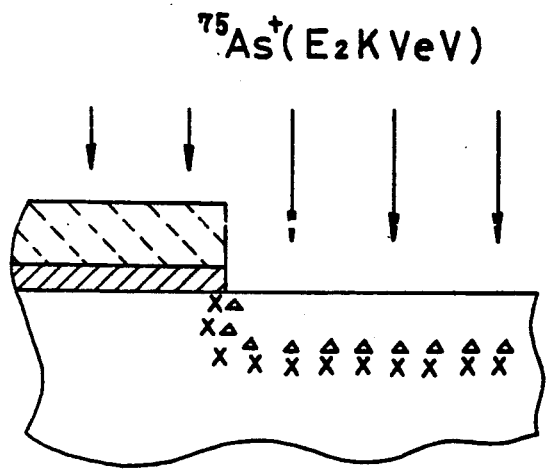
Figure 4E:
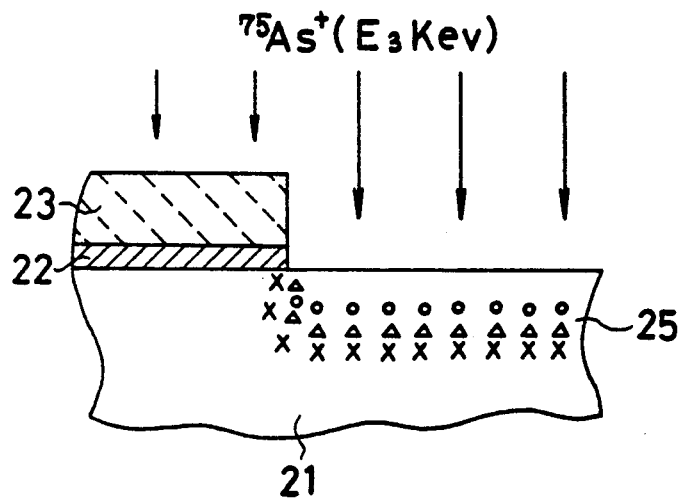
Figure 4F:
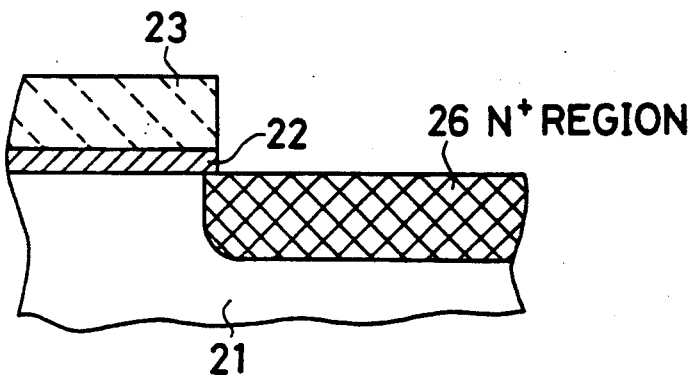
Figure 5:
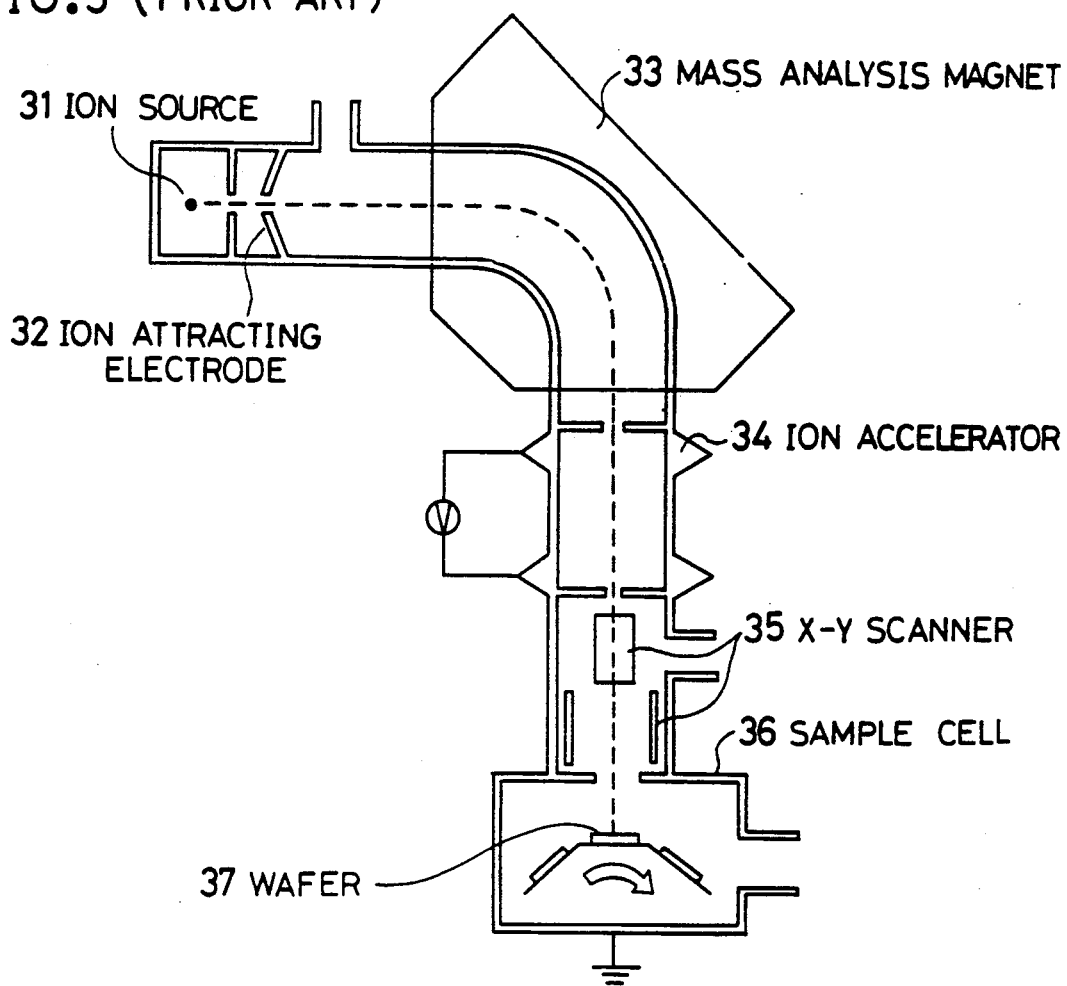
FIG. 5 is a schematic view showing the structure of a conventional ion implanting apparatus.
Figure 6:
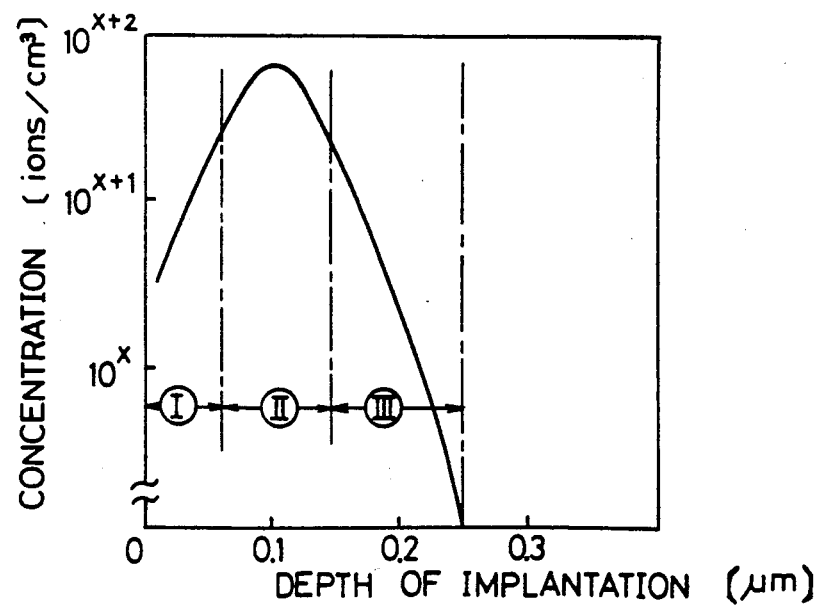
FIG. 6 is a graph showing a distribution model of implanted ions with regard to a depthwise direction of a sample when acceleration voltage is kept constant in the conventional embodiment.

Determination of an amount of the implanted ions in the aforementioned process is one of requirements for forming contiguous amorphous layers close to a region having the peak concentration of implanted ions with regard to the depthwise direction in the wafer at each applied energy. In FIG. 3, for example, a distribution of an implanted ion concentration is shown with regard to the depthwise direction from the surface of a Si wafer where the ions are implanted at the respective acceleration voltages mentioned above.

When the ions are implanted at the largest acceleration voltage $E_1$ (FIG. 2), the distribution of the implanted ion concentration in the wafer 11, or the Si substrate, corresponds to the Gaussian distribution shown in a curve $C_1$ in FIG. 3 (precisely, it is similar to the Gaussian distribution). An amount of the implanted ions is determined so as to form an amorphous layer $K_1$ near a region having the peak ion concentration at the acceleration voltage $E_1$. The amorphous layer K1 is formed between a point defect or cluster amorphous layer and a high density defect aggregation layer caused by implanting ions above solubility of ions to the wafer.

The distribution of an ion concentration when the acceleration voltage is reduced to the acceleration voltage $E_2$ is shown in a curve $C_2$. A damage caused by the implantation at the above acceleration voltage $E_2$ becomes an amorphous layer $K_2$. In implanting ions at this time, an amount of implanted ions is determined so that the amorphous layer $K_2$ is to be a crystal defect layer for which annealing is easily performed. Further, in the case that the acceleration voltage is reduced to the acceleration voltage $E_3$ lower than the acceleration voltage $E_2$, a distribution of an ion concentration corresponds to a curve $C_3$, and an amorphous layer caused at the acceleration voltage $E_3$ is an amorphous layer $K_3$. In this way, the dopants are implanted so that the peak values of a dopant concentration are set in almost the same range at the successively varied values of the acceleration voltage, and thus an amorphous layer defective zone $K_B$, which uniformly extends from the surface of the Si substrate in the depthwise direction is formed. In FIG. 3, taking a damage caused in the Si layer in earlier implantation of dopants into consideration, the peak value of an dopant concentration is set lower in later dopant implantation. An amount of dopant ions implanted into the amorphous layer defective zone $K_B$ is such that recovery is easily made by later heat treatment, and the dopants are implanted by division so that the dopants implanted each time is below its solubility to the wafer. As a result, recovery of the amorphous layer defective zone $K_B$ can be easily made by treatments related to other process steps carried out later. As a result of implanting dopants by dividing the irradiation of the ion beam, the quantity of the ion beam directed at the Si substrate each time is small, a sufficient period for cooling the wafer is set every time the acceleration voltage is changed, whereby the rising in temperature with ion implantation can be avoided so that elements, a resist mask, etc. are protected from heat, and indeterminable elements in a process simulation such as an annealing phenomenon due to heating during ion implantation can be eliminated.

An application of the aforementioned method of ion implantation to source-drain formation in a MOS field effect transistor will now be described with reference to FIG. 4.

(a) A gate oxide film 22 is formed on a P type silicon substrate 21 by heat oxidation. Further, after a gate electrode film 23 is formed on the gate oxide film 22, a photoresist is coated over the entire upper surface thereof. Then, a photoresist pattern 24 for forming an electrode, the gate electrode film 23 and the gate oxide film 22 are selectively etched in succession.

(b) The photoresist is removed, and the remaining gate electrode 23 and the gate oxide film 22 serves as a mask while $^{75}As^+$ ions are implanted to the P type silicon substrate 21 at the acceleration voltage $E_1$. The acceleration voltage $E_1$, for example, is set at approximately 80 KeV for the implantation rate of $2 \times 10^{15}/cm^2$ so that the peak concentration of the implanted ions becomes $10^{18} - 10^{21}/cm^3$.

(c) After the predetermined amount of ions are implanted at the acceleration voltage $E_1$, an ion beam is intercepted for about five minutes, for example, to fully cool the P type silicon substrate 21.

(d) The acceleration voltage of the ion beam is reduced to the acceleration voltage $E_2$ of 40 KeV, for example; the $^{75}As^+$ ions are implanted at the implantation rate of $1.5 \times 10^{15}/cm^2$; and then the beam is intercepted for cooling for a predetermined period of time.

(e) Further, the acceleration voltage of the ion beam is reduced to the acceleration voltage $E_3$ of 20 KeV, for example, and then the $^{75}As^+$ ions are implanted at the implantation rate of $7 \times 10^{14}/cm^2$, for example. The largest defective region $K_1$ (shown with X in FIG. 4) caused by the implantation at the acceleration voltage $E_1$, the largest defective region $K_2$ (shown with $\Delta$) caused by the implantation at the acceleration voltage $E_2$ and the largest defective region $K_3$ (shown with $\bigcirc$) caused by the implantation at the acceleration voltage $E_3$ are implanted with the $^{75}As^+$ ions at concentrations such as to form an amorphous zone of contiguous cluster defect, bar defect and point defect regions. The ion implantations for making these defective regions are carried out in accordance with an ion implantation program which is made based upon a preliminary experiment and calculation so that defect densities in the defective regions are almost the same.

The above processes (a) to (e) are performed several times in accordance with the ion implantation program to form an $N^+$ injected layer 25 in which the whole predetermined amount of ions is introduced.

(f) An $N^+$ high concentration dopant region 26 is formed by a heat treatment in a manufacturing step performed later. In the heat treatment, temperature and period of time necessary for processing depend on the type of the device. In accordance with the above mentioned ion implantation program, annealing is performed by a heat treatment as required. The heat treatment is performed at an annealing temperature of 600° C.-900° C. for about 10 minutes in the case of lamp annealing.

In order to avoid concentrating the defects just under the edge of the mask in implanting the ions, a very thin and gently sloping wall is formed along the edge of the mask in advance. This results in improved reliability of the device.

While there has been described in detail a preferred embodiment of the present invention, it is intended that the the present invention not be limited to the particular embodiment disclosed above, and various changes and modifications may be made without departing from the true scope of the invention. For example, implanting ions deeply causes a higher peak concentration of the implanted ions than implanting them lightly, in this embodiment. However, it is possible to implant ions with an ion concentration uniform with regard to the depthwise direction, and is also possible to implant ions with its concentration at a position nearer the surface being higher. The implanted dopants are not limited to arsenic.

As has been described in detail, by using an ion implanting apparatus and an ion implanting method according to the present invention, it is possible to form a low resistance dopant layer having an annealing efficiency higher than that of the conventional one without changing main manufacturing steps. This brings out a great effect on manufacturing of a semiconductor device of high integration. Also, in accordance with the present invention, dopants are implanted from the surface of the semiconductor substrate in the depthwise direction with a concentration within a predetermined range, and defects which are known from an experiment and which are recovered easily are caused uniformly, whereby an ion implanted layer which is activated with a low temperature can be formed.

Moreover, the dopant implanted layer formed by implanting ions according to the above method easily recovers by heat treatment with a relatively low temperature, and therefore the process of the invention can be performed in a low temperature. Further, the rising of temperature is inhibited in implanting ions since the ions are implanted by division, so that a resist mask is protected from heat, and indeterminable elements in the process such as an RED and annealing phenomenon caused in ion implanting can be eliminated. Additionally, a beam of ions is completely intercepted from the end station when the acceleration energy is changed, so that a high level of vacuum is kept in the sample cell.

What is claimed is:

1. An ion implantation method for forming in a semiconductor substrate an implanted layer of a dopant distributed as a substantially continuous dopant implanted layer comprising:

(a) irradiating a surface of said semiconductor substrate with an ion beam comprised of a beam of ions of said dopant, said ion beam having an acceleration energy, whereby said dopant ions are implanted into said semiconductor substrate with a peak dopant concentration at a particular depth in said semiconductor substrate, said peak dopant concentration being less than or equal to a concentration of said dopant ions that saturates said semiconductor substrate, and wherein said semiconductor is sufficiently irradiated as to form an amorphous layer at a depth in said semiconductor substrate proximate to said particular depth of said peak dopant concentration, said surface of said semiconductor substrate being at an ambient temperature before said irradiating;

(b) interrupting said irradiating of said semiconductor substrate by said ion beam for an interrupting period of time;

(c) reducing said acceleration energy of said ion beam during said interrupting period of time to a reduced acceleration energy, said interrupting period of time being sufficient to allow said surface of said semiconductor substrate to cool to approximately said ambient temperature and sufficient to allow said reduced acceleration energy of said ion beam to stabilize; and (d) repeating said steps (a) through (c) for said semiconductor substrate a selected number of times, wherein the peak dopant concentration for an acceleration energy of irradiation is greater than the peak dopant concentration for a next subsequent reduced acceleration energy of irradiation, whereby forming in said semiconductor substrate said substantially continuous dopant implanted layer comprised of said selected number of said amorphous layers contiguously disposed one upon another.

2. The method of claim 1, further comprising, after said step (d):

(e) annealing said semiconductor substrate sufficiently to recover any defects in said semiconductor substrate created during said repeated irradiating step, whereby said semiconductor substrate is restored to a crystalline structure.

3. The method of claim 1, wherein said surface of said semiconductor substrate is irradiated in step (a) at a dose of from about $1 \times 10^{15}$ ions/cm$^2$ to about $1 \times 10^{16}$ ions/cm$^2$.

4. The method of claim 1, wherein said acceleration energy of irradiation is reduced by approximately equal amounts for each successive repetition of said reducing step (c).

5. The method of claim 1, wherein said concentrations of said dopant ions implanted are such that said amorphous layers formed in said semiconductor substrate are capable of being restored to a crystalline structure upon annealing.

* * * * *